United States Patent [19]

Kaufman et al.

[11] Patent Number: 5,250,901
[45] Date of Patent: Oct. 5, 1993

[54] OPEN ARCHITECTURE IRON CORE ELECTROMAGNET FOR MRI USING SUPERCONDUCTIVE WINDING

[75] Inventors: Leon Kaufman, San Francisco; Joseph W. Carlson, Kensington, both of Calif.

[73] Assignee: The Regents of the University of California, Oakland, Calif.

[21] Appl. No.: 789,041

[22] Filed: Nov. 7, 1991

[51] Int. Cl.$^5$ .............................................. G01R 33/20
[52] U.S. Cl. ..................................................... 324/318
[58] Field of Search .............. 324/300, 307, 308, 309, 324/310, 311, 312, 313, 314, 316, 318, 320, 322; 128/653.5; 335/219, 300

[56] References Cited

U.S. PATENT DOCUMENTS

| | | | |
|---|---|---|---|
| 4,534,358 | 8/1985 | Young | 324/309 |
| 4,543,959 | 10/1985 | Sepponen | 324/309 |
| 4,571,568 | 2/1986 | Grangereau | 324/320 |
| 4,629,989 | 12/1986 | Riehl | 324/318 |
| 4,634,980 | 1/1987 | Misic | 324/318 |
| 4,714,886 | 12/1987 | Halpern | 324/316 |
| 4,721,914 | 1/1988 | Fukushima et al. | 324/320 |
| 4,829,252 | 5/1989 | Kaufman | 324/309 |
| 4,885,542 | 12/1989 | Yao et al. | 324/313 |

OTHER PUBLICATIONS

Hall et al., "Some Observations on the Utility of High-Temperature Superconducting Coils in Whole-Body MR Imaging," *Journal of Magnetic Resonance Imaging*, Mar./Apr. 1991, pp. 207-208.
Crooks et al.: "High-Temperatures Superconductors: Will New Materials Take the Chill Off Our Magnets?," *American Journal of Roentgenology*, 149:223, 1987.
Tsuchiyama, *Administrative Radiology VI* (VI):44, 1987; "Supercon Breakthrough: A Critical Leap?,".
Pearce, *Diagnostic Imaging*, 9(7):118, 1987, Pearce: "MRI Insights".
U.S. application Ser. No. 07/786,828, filed Nov. 1, 1991.
U.S. application Ser. No. 07/546,112, filed Apr. 13, 1990.

*Primary Examiner*—Michael J. Tokar
*Attorney, Agent, or Firm*—Nixon & Vanderhye

[57] ABSTRACT

A high $T_c$ superconductive electromagnet winding is advantageously employed as part of an MRI magnet structure having a pair of magnetically permeable poles opposingly disposed about the patient imaging volume. The magnetic circuit is otherwise completed by a magnetically permeable yoke structure having plural open apertures for easy access to the patient imaging volume. Still further advantage can be had by asymmetrically disposing a single superconductive electromagnet winding with respect to the patient image volume thereby eliminating the need for more than one cryostat. When high $T_c$ superconductive electromagnetic windings are utilized, a non-conductive composite cryostat may also be used to further reduce spurious eddy current fields. When an asymmetric single high $T_c$ superconductive electromagnet coil is utilized, an asymmetric electromagnet shim winding may also be employed so as to further increase the magnetic field homogeneity within what is now an asymmetrically located patient imaging volume within the air gap of the magnet structure.

30 Claims, 6 Drawing Sheets

FIG. 1 (PRIOR ART)
SUPERCONDUCTIVE SOLENOID-AIR MAGNETIC CIRCUIT

FIG. 2 (PRIOR ART)
SUPERCONDUCTIVE SOLENOID WITH OUTER MAGNETIC RETURN CIRCUIT

OPEN ARCHITECTURE IRON CORE ELECTROMAGNET FOR MRI USING SUPERCONDUCTIVE WINDING

CROSS-REFERENCES TO RELATED APPLICATIONS

This invention is related to the following commonly assigned U.S. patents and patent applications:
1. U.S. Pat. No. 4,829,252—Kaufman, "MRI SYSTEM WITH OPEN ACCESS TO PATIENT IMAGE VOLUME" filed Oct. 28, 1987 and issued May 9, 1989;
2. U.S. Pat. No. 4,885,542—Yao et al, "MRI COMPENSATED FOR SPURIOUS NMR FREQUENCY/PHASE CHANGES CAUSED BY SPURIOUS CHANGES IN MAGNETIC FIELDS DURING NMR DATA MEASUREMENT PROCESS" filed Apr. 14, 1988 and issued Dec. 5, 1989;
3. U.S. patent application Ser. No. 07/546,112—Kaufman et al, "MRI MAGNET WITH ROBUST LAMINATED MAGNETIC CIRCUIT MEMBER AND METHOD OF MAKING SAME" filed Apr. 13, 1990;
4. U.S. patent application Ser. No. 07/786,828—Kaufman, et al, "GRADIENT DRIVER CONTROL IN MAGNETIC RESONANCE IMAGING" filed Nov. 1, 1991 (allowed Dec. 4, 1992).

The entire contents of each of the above identified related commonly assigned U.S. patents and patent applications is hereby incorporated by reference.

BACKGROUND OF THE INVENTION

1. Field of the Invention

This invention generally relates to magnetic resonance imaging (MRI) utilizing nuclear magnetic resonance (NMR) phenomena. More particularly, this invention is directed to novel MRI magnet structures for use in an MRI system.

2. Description of the Prior Art

A great variety of MRI systems are now commercially available. They vary greatly in design criteria as well as in purchase, installation and operating costs. They also have considerably different technological strengths and weaknesses with respect to patient comfort, image quality, patient accessibility by attending physicians—and many other differences that will be readily understood by those skilled in the art of designing MRI systems.

As many in the art have already recognized, if MRI is to be increasingly utilized, then further improvements in the economics of MRI are highly desirable. At the same time, technological features related to image quality cannot be unduly sacrificed to economic goals. Since many MRI system design features simultaneously relate to many different desirable and undesirable MRI system features, it is quite difficult to find a truly optimum MRI system design that simultaneously tends toward all the desired goals (including lower economic costs).

At the present time, commercial MRI systems typically can be classified into two groups: (a) those using a large electromagnet to create the static background field $B_o$ and (b) those using a large permanent magnet structure to create the necessary static background field $B_o$. Although there are some resistive electromagnets with air and iron cores in use, most MRI electromagnets use low $T_c$ superconductive electromagnet solenoidal windings with an air core. On the other hand, the permanent magnet MRI systems typically utilize a large number of high strength permanent bar magnets arrayed symmetrically about upper and lower pole pieces located above and below an air gap in which the usual patient imaging volume is symmetrically located. In the latter permanent magnet MRI systems, the return magnetic circuit is typically completed with a magnetically permeable yoke. Other designs of rings of permanent magnet materials have been put forward but without commercial success; these yokeless permanent magnet systems will not concern us here.

The air core superconductive MRI electromagnet structures taken as one class are compared to a typical permanent MRI magnet system in the table below:

TABLE I

| Air Core Superconductive Electromagnet | Permanent Magnet (e.g., see U.S. Pat. No. 4,829,252 - Kaufman) |
|---|---|
| (a) Advantages | |
| 1. Moderate to high field strength at reasonable costs | 1. low cost at low fields |
| 2. high stability in magnetic field strength $B_o$ | 2. Open accessible patient volumes |
| 3. no Hysteresis in magnetic circuit (although this is no longer true for newer self-shielded magnets) | 3. Eddy currents can be controlled (See USSN 07/546,112 - Kaufman et al above) |
| | 4. No cryogen services required |
| (b) Disadvantages | |
| 1. Tunnel-like patient volumes | 1. Hysteresis in magnetic circuit |
| 2. Helium Consumption (cost/convenience) | 2. Poor stability of magnetic field strength $B_o$ |
| 3. Eddy currents in conductive metal cryostat | 3. Costs increase rapidly with increased field strength |
| 4. Costs do not decrease at low fields. | |

Of course one would like to find a way to simultaneously achieve all of the advantages of both MRI system types described above in Table I while eliminating all of their combined disadvantages Unfortunately, it is not easy to approach such an ideal design.

For example, one of the reasons that costs increase rapidly with increased field strength in permanent magnet systems is the cost, weight and volume of required permanent magnet material used to achieve such high field strength. If one considers using electromagnets instead to generate the driving magnetic field, then it is perhaps reasonable to expect that increased field strength might be achieved without such rapidly increasing economic costs. However, if the electromagnet driver is to use a resistive winding, there would be necessary added capital and operating costs involved in the need for continuously supplied electrical power (both for the magnet winding itself and for a suitable cooling system) as well as the need for cooling water and the like. There may also be additional problems encountered with stability.

On the other hand, if a conventional low $T_c$ superconducting electromagnet is to be used as a substitute for the permanent magnets, then it would inherit many of the disadvantages now associated with air core superconductive electromagnet MRI designs. For example, one would then encounter the cost and inconvenience of continuous helium cryogen consumption and the like. Furthermore, costs would not substantially decrease for low field designs using such conventional low $T_c$ superconducting drivers.

While others appear to have recognized the possibility that high $T_c$ superconducting materials may have applications in the MRI context as a means of replacing the low $T_c$ materials in currently available magnets, none are believed to have yet recognized that high $T_c$ materials may be utilized as the superconducting electromagnet windings for an MRI magnet design of open architecture resembling, in many advantageous respects, presently available permanent magnet MRI system designs. In short, it is not believed that others have yet recognized that high $T_c$ superconducting materials may be advantageously employed to effectively combine many of the advantageous features of presently existing disparate MRI magnet designs.

Some examples of prior suggestions for use of high $T_c$ superconducting materials in the MRI context are set forth below:

1. Hall et al, "Some Observations on the Utility of High-Temperature Superconducting Coils in Whole-Body MR Imaging," *Journal of Magnetic Resonance Imaging* March/April 1991, pp. 207–208;
2. Tsuchiyama, "Supercon Breakthrough: A Critical Leap?," *Administrative Radiology*, VI (VI):44, 1987;
3. Pearce, "MRI Insights," *Diagnostic Imaging*, 9(7):118, 1987; and
4. Crooks et al, "High-Temperatures Superconductors: Will New Materials Take the Chill Off Our Magnets?," *American Journal of Roentgenology*, 149:223, 1987.

In general, when high $T_c$ superconductors were discovered, there was considerable initial excitement in the technological community—including the MRI design community. Although initial commentaries typically included MRI as one of the fields that might be revolutionized by high $T_c$ superconducting materials (presumably because MRI was known to be a user of low $T_c$ superconducting materials), the design community tended to treat the topic somewhat conservatively (e.g., see the above noted references 2–4).

SUMMARY OF THE INVENTION

In general, if one considers high $T_c$ superconductors merely as a means of replacing currently used superconducting materials, no drastic changes to MRI magnet designs can be expected. However, when one considers a considerably different electromagnet design (e.g., one resembling current permanent magnet designs), a tremendous possibility for the use of high $T_c$ superconductors in MRI system design can be realized In particular, this provides an opportunity for a relatively large economic advantage that can be achieved by the relatively more simple cooling system requirements for high $T_c$ electromagnets.

Relatively high $T_c$ (e.g., liquid nitrogen 77° K. or higher $T_c$) superconducting materials are now available (e.g., from Sumitomo Electric and others). At this time, they exhibit somewhat lower critical current densities (e.g., 10,000 amperes per square centimeter as opposed to 100,000 amperes per square centimeter) and are produced only in shorter lengths than conventional low $T_c$ superconducting materials. Nevertheless, progress is rapidly moving forward in this field. When one compares the length x current carrying ability needed for high $T_c$ usages in both air core superconductive magnet designs and permanent magnet designs, one can begin to recognize that the requirements for permanent magnet MRI system designs are lower than for the typical air core superconductive magnet design. Thus, it is now believed that high $T_c$ superconductive electromagnet structures may be advantageously employed to modify the typical permanent magnet design and thus achieve some improved MRI system features.

Although high $T_c$ superconductive electromagnets will immediately be seen to exhibit some disadvantages when used in MRI systems, it is now believed that at least the major expected disadvantages can be suitably offset thus enabling the use of high $T_c$ driven electromagnets in the MRI system context in spite of these disadvantages.

For example, since only shorter lengths of high $T_c$ superconductive materials are presently available, this implies a greater number of joints in order to obtain an overall necessary length of superconducting material. This may cause operation in a non-persistent superconductive mode (rather than the desirable persistent superconductive mode). Nevertheless, even if the static magnetic field is thus gradually decaying, these effects can be compensated by currently available MRI system field stability correction procedures (e.g., see U.S. Pat. No. 4,885,542 referenced above). Of course, since a high $T_c$ driven electromagnet is contemplated for use in conjunction with magnetically permeable materials, this reduces the driving requirements as compared to those for purely air core magnet structure and permits relatively shorter total lengths of superconductor to nevertheless be effectively used as the electromagnet winding)

Although adverse hysteresis effects can be expected due to hysteresis effects unavoidably present in magnetically permeable iron materials, active real time closed loop control of gradient drivers and other pulsed electromagnets in the system can now be employed so as to effectively and substantially compensate any expected hysteresis effects (e.g., see the above referenced related copending and commonly assigned U.S. patent application Ser. No. 07/786,828. In addition, the laminated pole tip structure described in the above referenced copending related U.S. patent application Ser. No. 07/546,112 may also be utilized to help limit eddy current and eddy current/hysteresis effects in the proposed high $T_c$ driven MRI electromagnet.

Thus, a high $T_c$ MRI electromagnet is now believed to be both feasible and desirable. By using a high $T_c$ driven MRI electromagnet (and preferably in conjunction with the just mentioned compensating features now known in the art for correcting some of the major expected adverse effects), one could achieve a modified MRI system design having at least the following attractive features:

1. Low to moderate field strengths for low to moderate costs;
2. High stability in the background magnetic field $B_o$;
3. Effectively zero net hysteresis effects;
4. Open architecture magnetic circuit yoke designs so as to permit ready access to the patient imaging volume and to present the patient with a less confining structure;
5. Effectively zero net eddy current effects; and 6. Minimal (greatly reduced over current superconductive designs) cryogen services Clearly such a high $T_c$ driven MRI electromagnet appears to achieve a long sought goal: a way to simultaneously achieve, in one system, many of the most attractive features of the air core superconducting magnet and of the permanent magnet units now in common commercial service.

Figure 5:
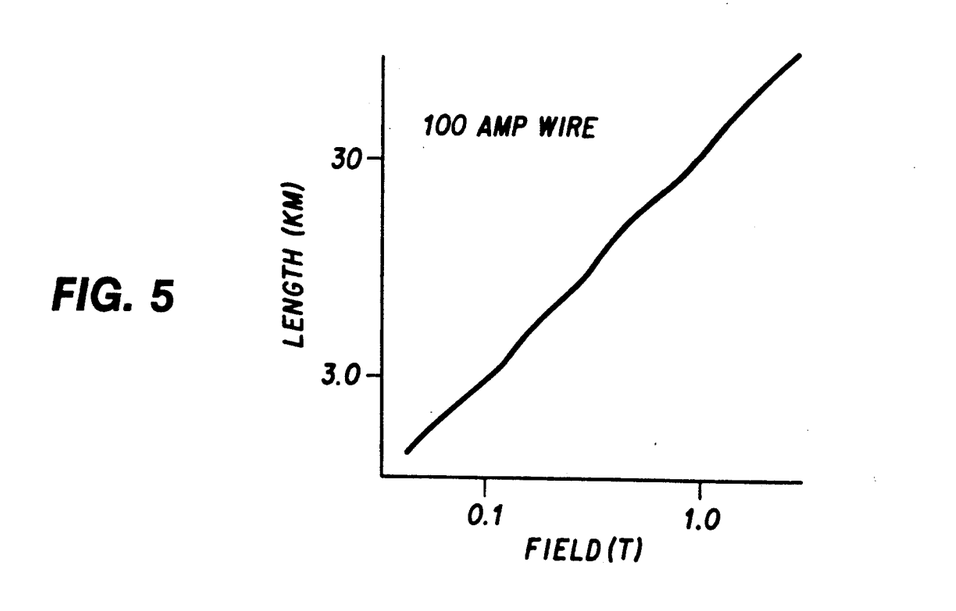
FIG. 5 is a graphical depiction of superconducting wire length needed for MRI electromagnets assuming that wire capable of carrying 100 amps at a field strength of about 1.3 times the operating field shown on the abscissa.

In effect, it has now been realized that unique features of high $T_c$ superconducting materials permit MRI electromagnet configurations not otherwise practical—including the possibility of eliminating tunnel-like imaging volume access and elimination of eddy current-inducing surfaces such as are associated typically with modern air core superconducting magnet structures. Such novel high $T_c$ electromagnet system designs should provide lower cost MRI, easier siting of MRI systems, enhanced image quality (as compared to existing permanent magnet MRI systems) and improved patient comfort These advantages should be available especially in the low to high ranges of background magnetic field strength $B_o$ desired for MRI systems. For example, even with currently available high $T_c$ superconducting materials, persistent superconducting operation may be expected for composite wire lengths on the order of ten kilometers to produce field strengths on the order of 0.5 Tesla. The general relationship between needed wire length and magnetic field $B_o$ is depicted at FIG. 5 for a wire capable of carrying 100 amps at a field strength of about 1.3 times the operating field shown on the abcissa.

A particularly advantageous configuration for a high $T_c$ superconductive-driven iron core MRI magnet is an asymmetric arrangement (which may also be of benefit with conventional low $T_c$ superconducting wires). The usual iron core permanent magnet MRI magnet configuration is symmetrical (e.g., so as to permit easier achievement of field homogeneity specifications). When using permanent magnet blocks (or resistive wire electromagnets), this involves a symmetrical placement of equal numbers of blocks or windings about both upper and lower pole members of the magnet structure. No particular advantage would derive in such circumstances from placing the total number of blocks or windings asymmetrically (e.g., all at the top or all at the bottom) since the total quantity of driving elements and system support requirements would remain fixed. In other words, one would simply achieve disadvantages associated with asymmetry of the structure while achieving no expected advantage.

However, when one considers a cryogenically cooled electromagnet in this sort of structure, we have discovered a considerable advantage for an asymmetric arrangement.

In a cryogenically cooled electromagnet, there are two major costs: the superconductive wire and the cryostat. Although there is no particular wire cost savings involved in asymmetric arrangements, there is a significant potential savings in cryostat costs if one uses an asymmetric arrangement. Namely, one can use only a single donut-shaped cryostat. Furthermore, there will be less coolant consumption (because there is decreased total surface to total volume ratio) if a single cryostat is used. Still further, since a non-conductive cryostat can be used at higher temperatures of high $T_c$ materials, eddy current problems can be reduced.

Although asymmetric placement of the magnetic driver does cause the region of greatest homogeneity to be asymmetrically shifted within the air gap between pole pieces, this can be accommodated partly by relocating the patient anatomy to be imaged and partly by reshaping the pole pieces and/or by adding asymmetric shim coils to enhance homogeneity at desired locations in the air gap. In particular, by making the opposing pole piece convex in shape, substantial improvement in homogeneity can be attained.

BRIEF DESCRIPTION OF THE DRAWINGS

These as well as other advantages and features of this invention will be more completely understood and appreciated by careful study of the following detailed description of presently preferred exemplary embodiments taken in conjunction with the accompanying drawings, of which.

DETAILED DESCRIPTION OF EXEMPLARY EMBODIMENTS

As mentioned above, resistive electromagnets have been used in MRI systems for generating the required high strength static background field $B_o$. However, because of the need to supply continuing electrical power and the need to supply continuous cooling for the resistive coil (as well as other attendant disadvantages), there are upper limits to the static field strength that can be obtained within reasonable economic limits (e.g., on the order of 0.4 Tesla).

To avoid problems with hysteresis, perhaps the most common commercial MRI system uses superconductive solenoid windings with magnetic circuits that are substantially only air (which is simultaneously not subject to weight, saturation, hysteresis, etc. difficulties).

Figure 1:
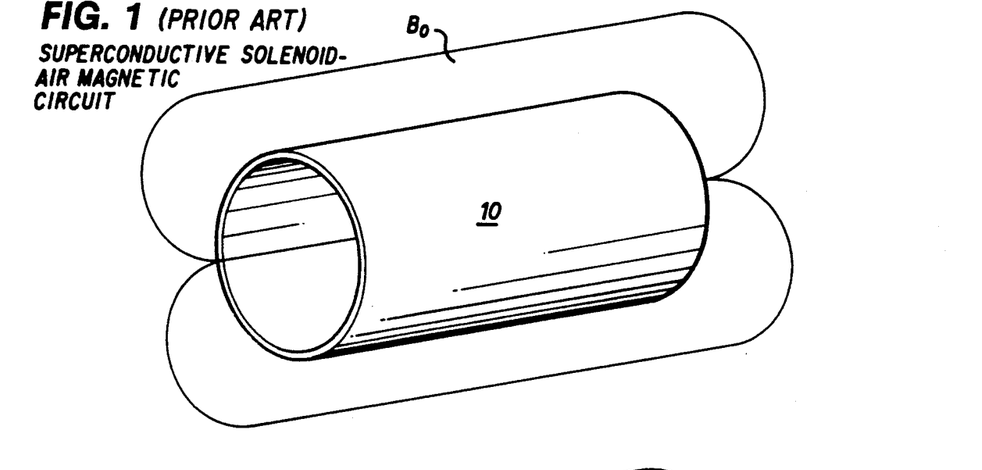
FIG. 1 is a schematic illustration of a typical conventional superconductive solenoid MRI magnet using only air as the magnetic circuit medium.
Figure 2:
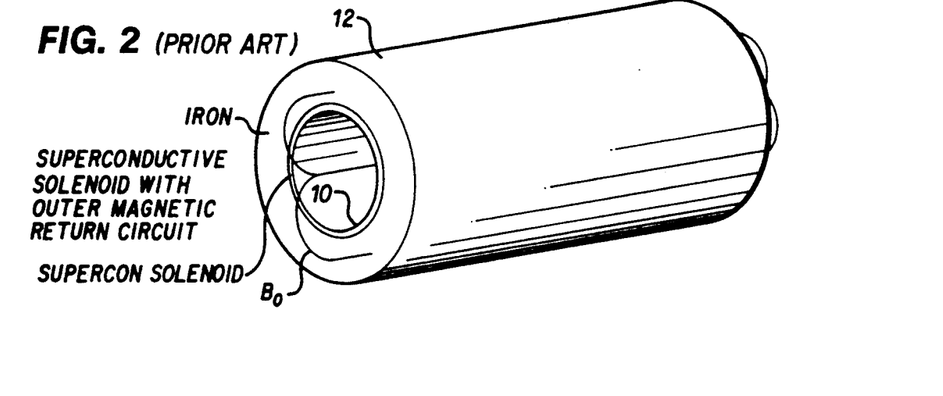
FIG. 2 is a similar schematic depiction of a prior art superconductive solenoid MRI magnet which uses an outer magnetically permeable iron return circuit path for the magnetic field of a superconducting solenoid.

FIG. 1 depicts a typical prior art superconductive solenoid 10 which produces magnetic flux passing through substantially only air as the magnetic circuit (i.e., both inside and outside the superconductive solenoidal coil 10). However, at least one prior art structure is believed to have included a magnetically permeable (e.g., iron) return circuit 12 for the magnetic flux as is depicted at FIG. 2. The prior art structure depicted in FIG. 2 may be, for example, the Toshiba MRT-50 which operates at 0.5 Tesla.

Many of the disadvantages of these prior superconducting electromagnets for MRI systems have been noted above. By contrast, typical prior art permanent magnet MRI systems of the type depicted in FIG. 3 have a tremendous number of advantages (e.g., see U.S. Pat. No. 4,829,252—Kaufman). Among these advantages are typically open architecture structures. The iron yoke 30 for return magnetic flux is typically comprised of massive end plates connected by four massive posts at the corners of a magnet structure thus leaving four relatively large open access ports to the patient imaging volume. The usual opposing pole pieces 32, 34 and opposing gradient coil sets 36, 38 are explained more fully in U.S. Pat. No. 4,829,252—Kaufman. The magnetic force is supplied by symmetric arrays of permanent bar magnets 40, 42 as will also be appreciated by those in the art. Such commercially available permanent magnet MRI systems also tend to be considerably lower priced to purchase and to operate. Unfortunately, as one attempts to increase the magnetic field strength $B_o$, the costs associated with a permanent MRI magnet rise quickly (see FIG. 4) while those for a traditional superconducting air core magnet tend to increase rather slowly (from an initially considerably higher point) as is also depicted at FIG. 4. Thus, for higher strength magnetic fields, economic as well as other considerations would seem to preclude the use of open architecture iron core electromagnet structures.

As shown in FIG. 5, relatively shorter lengths of relatively low 100 amp superconducting wire (e.g., as may even now be achievable by connecting shorter lengths of high $T_c$ superconducting materials) can be used to generate relatively large magnetic field strengths.

Figure 6:
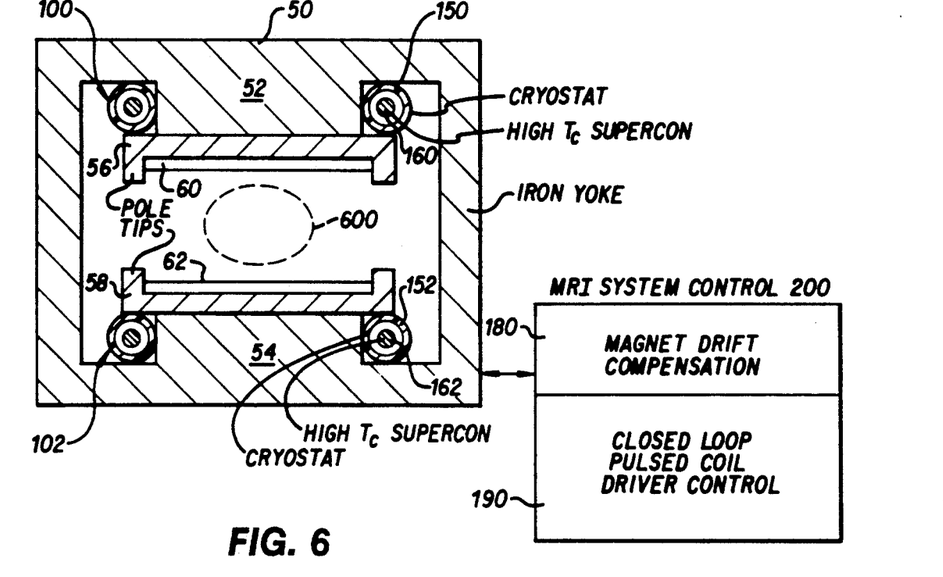
FIG. 6 is a schematic depiction of a first exemplary embodiment of this invention wherein high $T_c$ superconducting electromagnets are utilized as a substitute for the arrays of permanent magnets in the permanent MRI system design of FIG. 3.

As depicted in the embodiment of FIG. 6, an open architecture magnetically permeable yoke 50 similar in most respects to that used with conventional permanent magnet structures is employed. In particular, it would comprise the usual massive end plates connected typically by four massive posts, one at each corner of the magnet structure. The schematic cross-sectional depiction of iron yoke 50 in FIG. 6 is thus intended to be of the same open architecture as that shown in U.S. Pat. No. 4,829,252. However, at the upper pole area 52 and at the lower pole area 54, there are no arrays of permanent magnets 40, 42 as in the prior art (e.g., see FIG. 3). Instead, the magnetically permeable yoke structure is continued as necessary so as to mate with upper pole piece 56 and lower pole piece 58 (which are preferably of the laminated robust construction described in co-pending related, commonly assigned U.S. patent application Ser. No. 07/546,112). The usual "pancake" gradient coils 60 and 62 will be disposed in conjunction with pole pieces 56, 58 as will be appreciated by those in the art.

Figure 3:
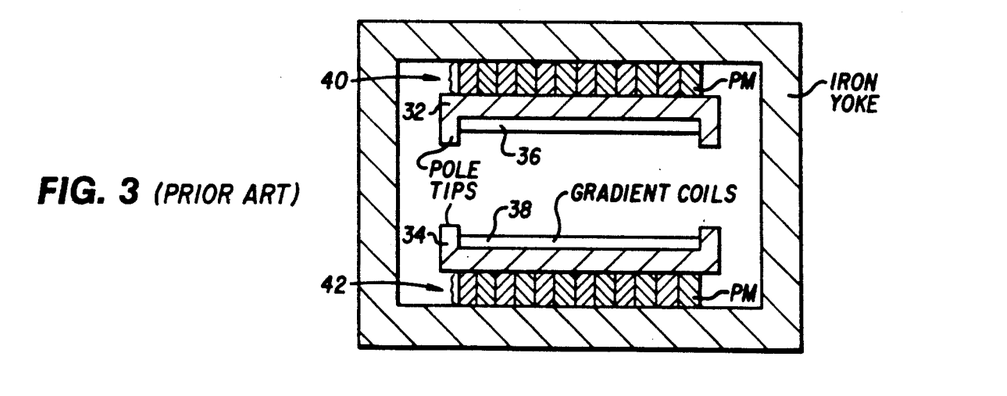
FIG. 3 is a schematic cross-sectional depiction of a conventional MRI system having an open architecture and symmetrically arranged arrays of permanent magnets, opposing pole pieces, magnetically permeable open apertured return magnetic circuit yoke, etc. (e.g., as described more completely in U.S. Pat. No. 4,829,252—Kaufman)
Figure 4:
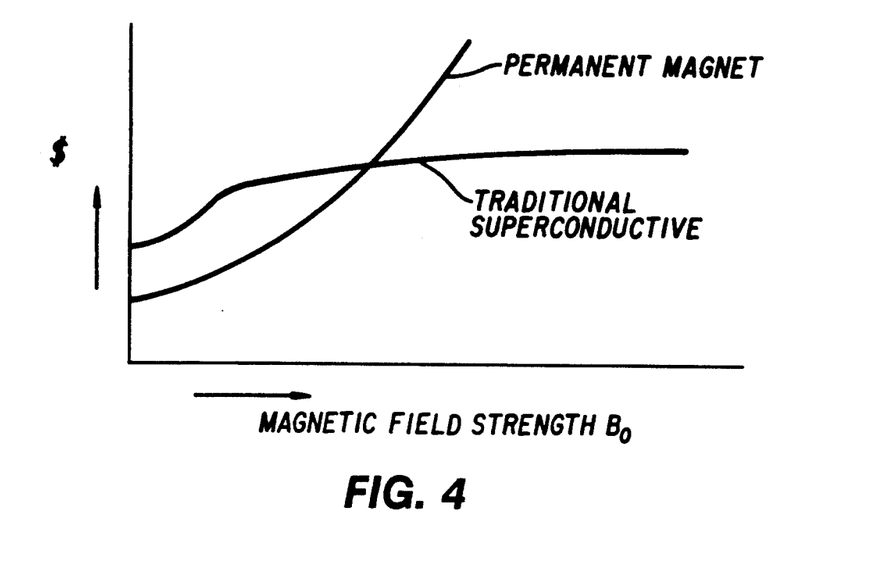
FIG. 4 is a graphical schematic depiction of the general manner in which MRI system costs increase as a function of increasing magnetic field strength for the necessary background MRI magnet field $B_o$.

In the embodiment of FIG. 6, instead of the permanent magnet arrays 40, 42 used in the prior art structure of FIG. 3, symmetrical high $T_c$ superconductive electromagnets 100 and 102 are respectively associated with the upper pole 52 and lower pole 54 of the magnetically permeable yoke 50 as depicted in FIG. 6. As depicted in schematic cross-section, each superconducting electromagnet includes a relatively small donut-shaped cryostat 150 and 152, respectively. Since high $T_c$ superconducting material is utilized as the superconductor coil windings 160, 162, the cryostats 150, 152 may be made of non-conductive composite materials (e.g., fiberglass-type material) as is conventionally known to be possible in the art when high $T_c$ superconductive materials are being utilized (e.g., in conjunction with liquid nitrogen as the cryogen). In particular, it should be noted that the cryostats 150, 152 do not need to be of the extended cylindrical torus geometry required for the usual superconductive electromagnets of FIGS. 1 and 2 (e.g., typically formed of electrically conductive metals and having an inside diameter on the order of 1 meter or so and an axial length of two meters). Instead, since only relatively small, higher temperature, donut-shaped cryostats 150, 152 are required, they may be considerably cheaper to construct and maintain. Since non-conductive cryostats may be used, eddy current problems normally associated with superconductive MRI electromagnets may be eliminated.

For currently available high $T_c$ materials, the longest available lengths are much shorter than those for low $T_c$ superconducting materials. This implies the need for an increased number of joints in the electromagnet winding. Nevertheless, it is believed that high $T_c$ materials can be used for a feasible MRI magnet design in spite of the increased number of joints that must be accommodated. Furthermore, even though high $T_c$ materials may presently cost more per meter than low $T_c$ materials, for at least lower field strengths (and in recognition of the reduced magnetic drive needed when the return path is a magnetically permeable material as in traditional permanent designs), one can afford to pay more per meter and still have an economic MRI system design.

In the event that cryostats 150, 152 are made from metal rather than from the preferred composite non-conductive materials then they should preferably be spaced as far as possible from gradient coils 60, 62 so as to minimize expected eddy current problems.

As might be expected for the symmetric embodiment of FIG. 6, the volume of highest homogeneity 600 is symmetrically located within the air gap between top pole piece 56 and bottom pole piece 58. Thus, the patient imaging volume may be symmetrically located at this mid-gap region as in conventional permanent magnet MRI systems.

Because a greater number of joints must be accommodated in use of high $T_c$ superconductive materials, it is possible that a semi-persistent superconductive mode will have to be endured. Nevertheless, it is believed that the superconductive mode will be sufficiently persistent to permit the complete imaging procedure for at least one patient before the need to recharge the superconductive winding with additional electrical energy. Such a relatively slow decay in magnet strength can be handled by magnet drift compensation techniques now known in the art (e.g., see U.S. Pat. No. 4,885,542). Such magnet drift compensation is schematically indicated at block 180 in FIG. 6.

Closed loop pulsed coil driver control 190 (e.g., as described in related copending U.S. patent application Ser. No. 07/786,828 is also schematically depicted in block form as part of an otherwise typical MRI system control 200 in FIG. 6. Such a real-time closed loop feedback driver circuit responds to a flux sensing coil (e.g., a virtual replica of a given drive coil albeit using fewer turns and smaller conductor) which creates a feedback signal representing the actual net generated flux (e.g., the actual flux with all eddy current or other spurious constituents included). An integral feedback control responding to the feedback signal and to a supplied flux demand signal then creates the current pulses driving the pulsed electromagnet with just the right shaped and timed driving pulse.

As will be appreciated by those in the art and by study of the above-referenced related U.S. patents and patent applications herein incorporated by reference, compensation 180 and control 190 are associated with the processing of collected MRI data and/or with active ongoing control of pulsed electromagnets (e.g., gradient coils 60, 62). It is not believed necessary here to detail the many and complex features of an entire MRI system since such would merely obscure the novel, advantageous features of the invention now being explained.

Figure 7:
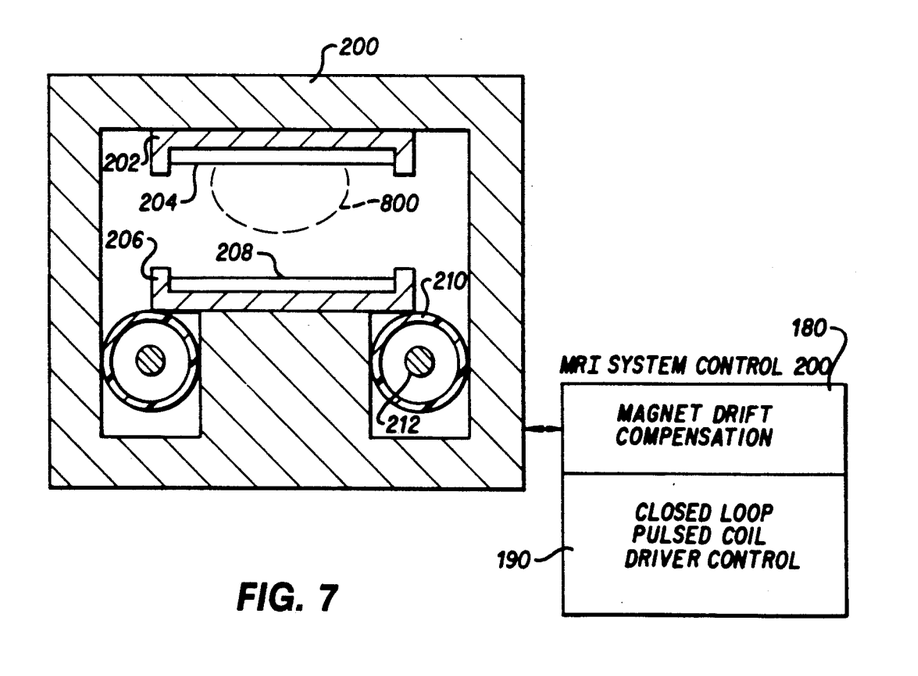
FIG. 7 is a further exemplary embodiment of this invention employing an asymmetrically disposed single superconducting electromagnet as the driver in an open architecture MRI system design that is otherwise similar in many respects to the existing permanent magnet design of FIG. 3.

An asymmetric embodiment is depicted in FIG. 7. Here, the usual open architecture yoke of magnetically permeable material 200 (e.g., as in U.S. Pat. No. 4,829,252) is again employed. Once again, the usual symmetric array of permanent magnet drivers is omitted. However, there is no magnetic field driver associated with one of the pole pieces (e.g., upper pole piece 202 and its usual gradient coils 204). At the same time, a magnet driver of twice the usual size for a given magnet field strength is associated solely with the other pole piece (e.g., bottom pole piece 206 and its associated magnetic gradient coils 208). Now only a single donut-shaped cryostat 210 is employed with a single superconducting electromagnet coil 212. As before, if the superconducting wire 212 uses high $T_c$ materials, then the cryostat 210 may preferably be made of a non-conducting composite material to reduce eddy current effects. As in the embodiment of FIG. 6, the MRI system control 200 incorporated as part of the overall MRI system preferably includes magnet drift compensation 180 (e.g., as in U.S. Pat. No. 4,885,542), as well as real time closed loop pulsed coil driver control 190 (e.g., as in U.S. patent application Ser. No. 07/786,828.

As already mentioned, there are considerable cost savings associated with the fact that the embodiment of FIG. 7 employs but a single cryostat 210. At the same time, the field configurations in the air gap between pole pieces 202, 206 will be affected by the asymmetry of the magnetic field driver. In particular, the highest homogeneity region 800 is no longer located in the mid-gap region. Rather, it is also asymmetrically located. Since the upper pole piece 202 may be thought of as the midplane of a symmetrically driven magnet structure (e.g., where the bottom driven magnet structure is effectively reflected about the plane of the upper pole piece 202), the highest homogeneity region will move asymmetrically towards the upper pole piece 202. As will be explained in conjunction with FIGS. 8-12, this reduced homogeneity can be compensated, at least in part, by appropriate shaping of the opposing or top pole piece 202 and/or by the addition of asymmetric shim coils. It is believed that once properly compensated in this manner, the asymmetric embodiment of FIG. 7 will provide significant cost reductions (both initially and ongoing with respect to consumption of cryogens) since there is only a single relatively small donut-shaped cryostat now required.

Figure 9:
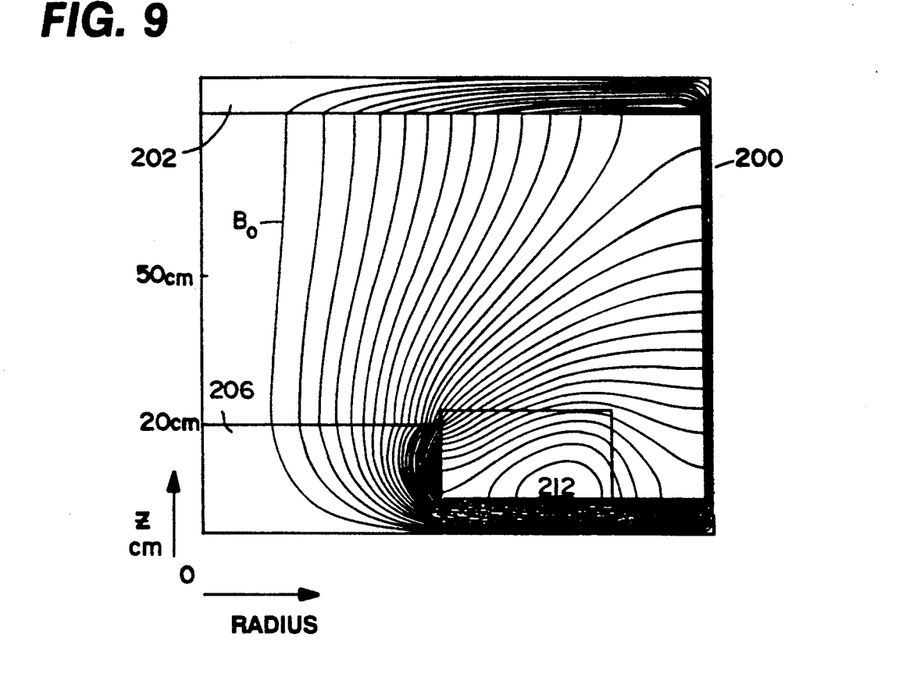
FIGS. 9-12 schematically depict various asymmetric electromagnet driver designs for an MRI magnet including techniques for increasing homogeneity by adding a convex "dimple" to the opposing pole tip and/or by adding asymmetric shim coils to the pole tips.

As depicted in FIG. 9, the asymmetric driver coil 212 introduces odd-order terms in the field inhomogeneity to be expected. FIG. 9 is a computer-drawn schematic depiction taken across the path of an asymmetric structure similar to that of FIG. 7 assuming a flat bottom pole piece 206 and a flat top pole piece 202. As shown, the radius increases from left to right (e.g., from the center of the magnet structure shown in FIG. 7 toward one extremity, assuming circular symmetry about a vertical axis at the left margin of the drawing for this explanatory purpose) while the distance Z increases from the bottom of the structure towards the top (the bottom pole piece 206 having an upper surface at $Z=20$ centimeters and the mid air gap point being located at $Z=50$ centimeters.

Figure 8:
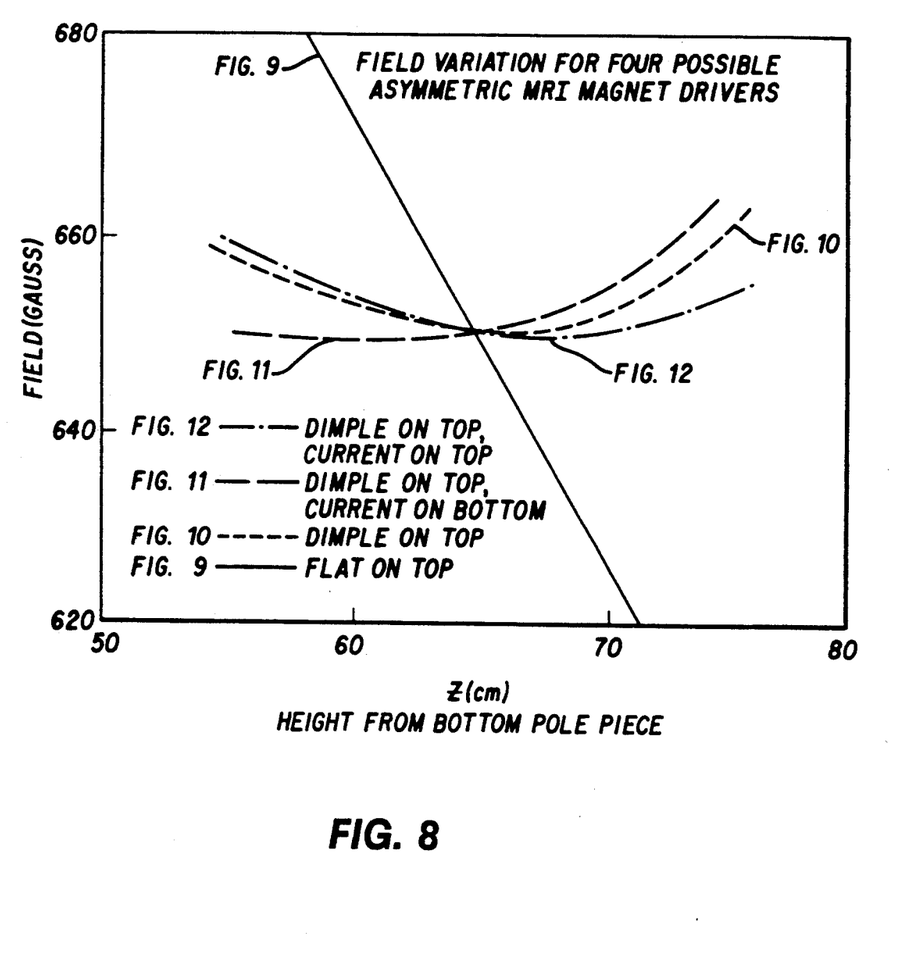
FIG. 8 is a computer-generated graph showing field strength variations as a function of position in the air gap for the asymmetric electromagnet driver designs as shown in FIGS. 9-12.

In the example of FIG. 9, where simple flat pole pieces 206, 202 are assumed, one can expect a rather large linear gradient in the field distribution along Z (e.g., at zero radius as is depicted by the solid line in the graph of FIG. 8). However, merely by providing a convex upper pole tip 202' as depicted in FIG. 10, the linear gradient can be substantially eliminated—albeit leaving behind an inhomogeneity mostly dominated by a second order term as is depicted by the dotted line in the graph of FIG. 8.

Figure 10:
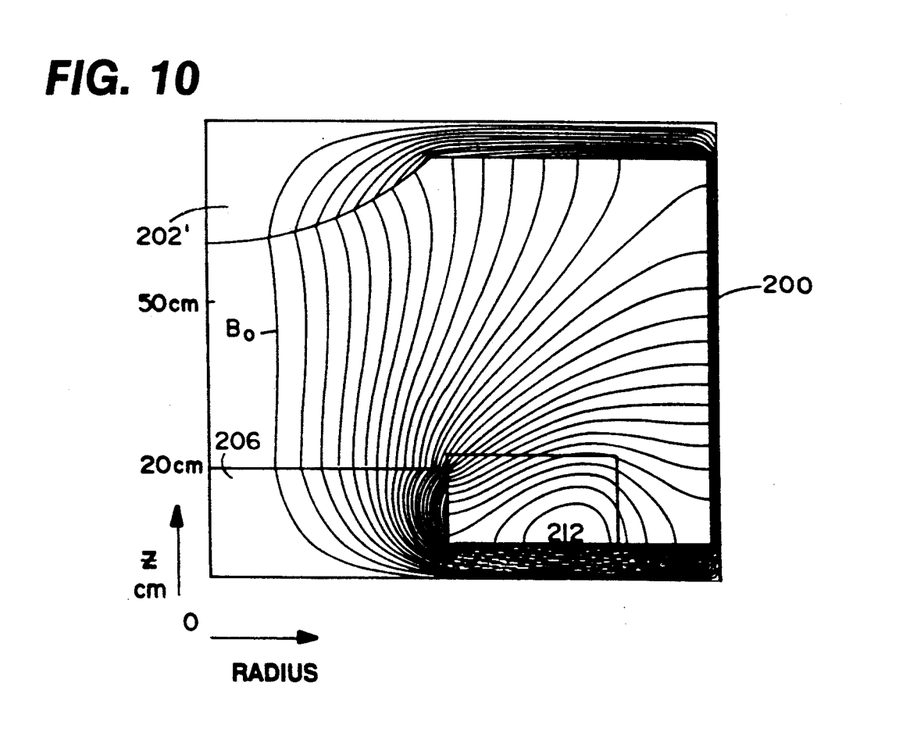
Figure 11:
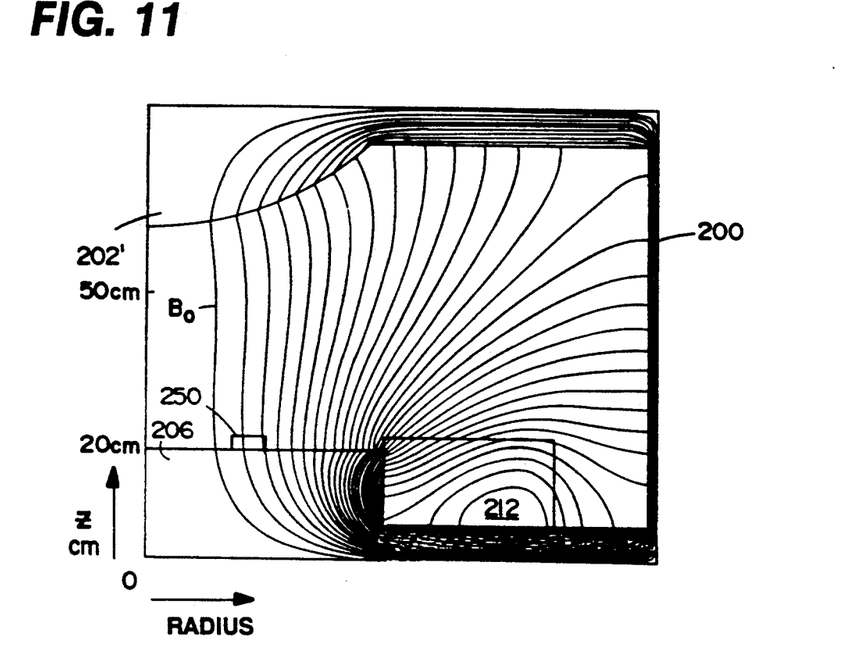

FIG. 11 depicts a magnetically permeable structure similar to that shown in FIG. 10 (e.g., where the upper pole piece 202' is of a descending convex or "dimple" shape) but also includes an additional shim coil 250 associated asymmetrically with only one of the pole pieces (e.g., lower pole piece 206 in FIG. 11). This relatively small shim current on the bottom pole piece as shown in FIG. 11 may be used to "flatten" the magnetic field line distributions preferentially on the lower side (as depicted in FIG. 11 by the computer-drawn field lines and as depicted by a dotted line in the graph of FIG. 8).

Figure 12:
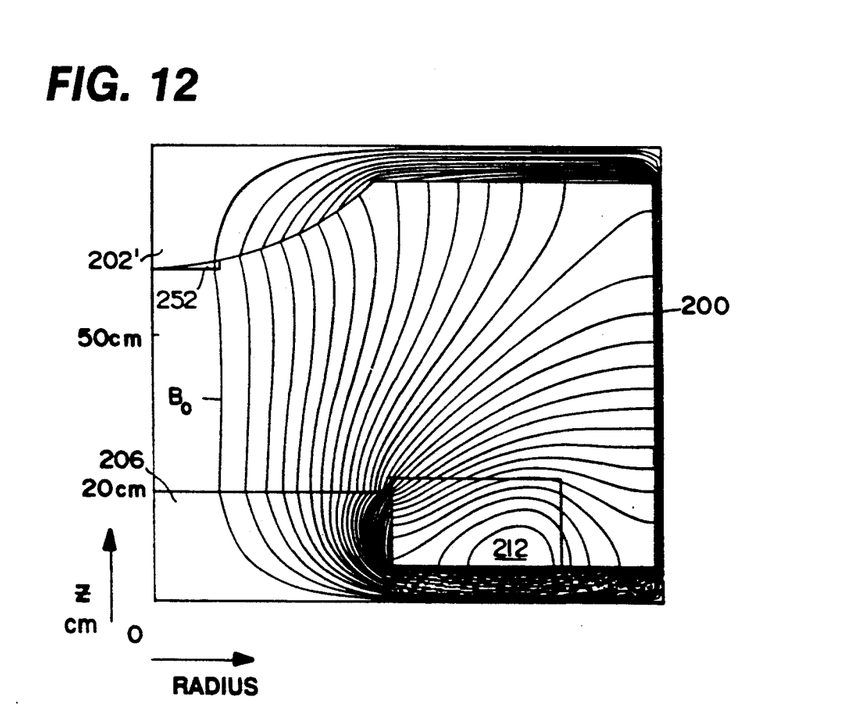

Similarly, as depicted in FIG. 12, a shim coil 252 asymmetrically disposed only at the upper convex-shaped pole piece 202' may be used to achieve a different dimension of homogeneity (e.g., as depicted by the dashed dot line in the graph of FIG. 8). As will be appreciated by those versed in the art of designing MRI magnet pole tips and shim coils for enhancing homogeneity, various combinations of shim coils and pole piece shaping can be used to substantially cancel second order (as well as higher order) inhomogenities—once the major linear asymmetry has been eliminated or significantly reduced (e.g., by using a convex opposing pole face).

While only a few exemplary embodiments of this invention have been described in detail, those skilled in the art will appreciate that many variations and modifications may be made in these exemplary embodiments while yet retaining many of the advantageous novel features and advantages of this invention. Accordingly, all such variations and modifications are intended to be included within the scope of the appended claims.

We claim:

1. An MRI magnet structure comprising:
   a pair of magnetically permeable poles having faces opposingly disposed about an air gap including a patient imaging volume;
   a magnetically permeable yoke structure, providing a magnetic flux return circuit between said poles, said yoke structure including apertures for access to said patient imaging volume; and
   at least one high $T_c$ superconductive electromagnet magnetically coupled to said poles to generate a MRI static magnetic field $B_o$ within said imaging volume in said air gap when energized.

2. An MRI magnet structure as in claim 1 wherein there are at least two of said high $T_c$ superconductive electromagnets, at least one such electromagnet being disposed about each of said poles.

3. An MRI magnet structure as in claim 2 wherein said patient imaging volume is symmetrically disposed within said air gap between said pole faces.

4. An MRI magnet structure as in claim 1, 2 or 3 further comprising a cryostat containing each said electromagnet.

5. An MRI magnet structure as in claim 1 wherein said high $T_c$ superconductive electromagnet is disposed about only one of said poles thereby creating an asymmetry which moves the patient imaging volume asymmetrically toward the other of said poles.

6. An MRI magnet structure as in claim 5 wherein said other of said poles has a convex front face portion to increase magnetic field homogeneity within said asymmetrically located patient imaging volume.

7. An MRI magnet structure as in claim 6 further comprising:
   at least one electromagnet shim winding disposed adjacent at least one of said poles to increase homogeneity within said asymmetrically located patient imaging volume.

8. An MRI magnet structure as in claim 5 wherein said high $T_c$ superconductive electromagnet is disposed in a single non-conductive cryostat encircling said one of said poles.

9. An MRI magnet structure as in claim 1 wherein said magnetically permeable poles each include a laminated pole tip structure to reduce eddy currents therein.

10. An MRI magnet structure as in claim 1, 5 or 9 further comprising:
    at least one electromagnet which, in use, is driven by current pulses;
    at least one magnetic flux sensing coil disposed to sense the magnetic flux generated by said electromagnet driven by current pulses; and
    a real-time closed loop feedback driver circuit connected to generate said current pulses as a function of the magnetic flux sensed by said sensing coil and a signal representing desired flux so as to compensate for adverse phenomena otherwise affecting the net generated flux.

11. An MRI magnet structure as in claim 1 in combination with:
    an MRI control system for processing MRI data obtained from within said magnet structure and including means to compensate said MRI data for drift in the magnitude of the nominally static field $B_o$.

12. An MRI magnet structure as in claim 10 in combination with:
    an MRI control system for processing MRI data obtained from within said magnet structure and including means to compensate said MRI data for drift in the magnitude of the nominally static field $B_o$.

13. An MRI magnet structure as in claim 9 in combination with:
    an MRI control system for processing MRI data obtained from within said magnet structure and including means to compensate said MRI data for drift in the magnitude of the nominally static field $B_o$.

14. An MRI magnet structure as in claim 1 wherein said magnetically permeable yoke structure comprises:
    top and bottom horizontal plates interconnected by vertical posts defining access apertures to a patient imaging volume.

15. An MRI magnet structure as in claim 11 wherein there are at least two of said high $T_c$ superconductive electromagnets, at least one such electromagnet being disposed about each of said poles.

16. An MRI magnet structure as in claim 11 wherein said high $T_c$ superconductive electromagnet is disposed about only one of said poles thereby creating an asymmetry which moves the patient imaging volume asymmetrically toward the other of said poles.

17. An MRI magnet structure as in claim 16 wherein said other of said poles has a convex front face portion to increase magnetic field homogeneity within said asymmetrically located patient imaging volume.

18. An MRI magnet structure as in claim 17 further comprising:
    at least one electromagnet shim winding disposed adjacent at least one of said poles to increase homogeneity within said asymmetrically located patient imaging volume.

19. An MRI magnet structure as in claim 16 wherein said high $T_c$ superconductive electromagnet is disposed in a single donut-shaped non-conductive cryostat encircling said one of said poles.

20. An MRI magnet structure as in claim 16 wherein said magnetically permeable poles each include a laminated pole tip structure to reduce eddy currents therein.

21. An MRI magnet structure as in claim 16 or 20 further comprising:
    at least one further electromagnet which, in use, is driven by current pulses;
    at least one magnetic flux sensing coil disposed to sense the magnetic flux generated by said further electromagnet; and
    a real-time closed loop feedback driver circuit connected to generate said current pulses as a function of the magnetic flux sensed by said sensing coil and a signal representing desired flux so as to compensate for adverse phenomena otherwise affecting the net generated flux.

22. An MRI magnet structure comprising:
    a pair of magnetically permeable poles having faces opposingly disposed about an air gap including a patient imaging volume;
    a magnetically permeable yoke structure providing a magnetic flux return circuit between said poles, said yoke structure including plural open apertures for access to said patient volume; and
    a single superconductive electromagnet disposed on said magnet structure.

23. An MRI magnet structure as in claim 22 wherein said superconductive electromagnet includes only a single electromagnet disposed asymmetrically nearer to one of said poles than to the other of said poles thereby producing an asymmetrically disposed patient imaging volume.

24. An MRI magnet structure as in claim 23 wherein said other of said poles has a convex front face portion to increase magnetic field homogeneity within said asymmetrically located patient imaging volume.

25. An MRI magnet structure as in claim 24 further comprising:
at least one electromagnet shim winding disposed adjacent at least one of said poles to increase homogeneity within said asymmetrically located patient imaging volume.

26. An MRI magnet structure as in claim 22 or 23 wherein said superconductive electromagnet is disposed in a single cryostat encircling a portion of the magnetically permeable structure.

27. An MRI magnet structure as in claim 22 or 23 wherein said magnetically permeable poles each include a laminated pole tip structure to reduce eddy currents therein.

28. An MRI magnet structure as in claim 33 or 23 further comprising:
at least one further electromagnet which, in use, is driven by current pulses;
at least one magnetic flux sensing coil disposed to sense the magnetic flux generated by said further electromagnet; and
a real-time closed loop feedback driver circuit connected to generate said current pulses as a function of the magnetic flux sensed by said sensing coil and a signal representing desired flux so as to compensate for adverse phenomena otherwise affecting the net generated flux.

29. An MRI magnet structure as in claim 22 or 23 in combination with:
an MRI control system for processing MRI data obtained from within said magnet structure and including means to compensate said MRI data for drift in the magnitude of the nominally static field $B_o$.

30. An MRI magnet structure as in claim 22 or 23 wherein said magnetically permeable yoke structure comprises:
top and bottom horizontal plates interconnected by vertical posts defining access apertures to a patient imaging volume.

* * * * *